(12) United States Patent
Zhu

(10) Patent No.: US 11,522,539 B1
(45) Date of Patent: Dec. 6, 2022

(54) CHARGING DEVICE

(71) Applicant: Hypower Microelectronics (Wuxi) Co., Ltd., Wuxi (CN)

(72) Inventor: Ning Zhu, Wuxi (CN)

(73) Assignee: Hypower Microelectronics (Wuxi) Co., Ltd., Wuxi (CN)

( * ) Notice: Subject to any disclaimer, the term of this patent is extended or adjusted under 35 U.S.C. 154(b) by 0 days.

(21) Appl. No.: 17/486,779

(22) Filed: Sep. 27, 2021

(30) Foreign Application Priority Data

Aug. 13, 2021 (CN) .......................... 202110928600.4

(51) Int. Cl.
*H03K 3/00* (2006.01)
*H03K 17/16* (2006.01)
*H03K 17/30* (2006.01)
*H03K 17/687* (2006.01)

(52) U.S. Cl.
CPC .................................. *H03K 17/687* (2013.01)

(58) Field of Classification Search
None
See application file for complete search history.

(56) References Cited

U.S. PATENT DOCUMENTS

| | | | | |
|---|---|---|---|---|
| 5,168,175 A | * | 12/1992 | Endo | ....................... G05F 1/573 327/566 |
| 6,353,546 B1 | * | 3/2002 | Tsay | .................... H02M 7/2176 363/89 |
| 6,624,994 B1 | * | 9/2003 | Schmoock | ......... H03K 17/0822 323/908 |
| 6,943,611 B2 | * | 9/2005 | Braun | .............. H03K 17/08122 327/108 |

* cited by examiner

*Primary Examiner* — Kenneth B Wells
(74) *Attorney, Agent, or Firm* — Fideli Law PLLC

(57) ABSTRACT

The disclosure provides a charging device, which includes an input terminal configured to receive an input voltage; an output terminal configured to connect a target load so as to charge the target load; a control terminal, configured to receive a control voltage; a junction field-effect transistor and a control circuit. The junction field-effect transistor includes at least: a drain, electrically connected to the input terminal so as to receive the input voltage; a source, electrically connected to the output terminal so as to output an output voltage and an output current; and a gate, electrically connected to the control terminal. The control circuit is electrically connected to the control terminal, and configured to change the control voltage based on a change in a load voltage so as to change a pinch-off voltage of the JFET by controlling a bias voltage on the gate, thereby controlling the output current.

18 Claims, 2 Drawing Sheets

CHARGING DEVICE

RELATED APPLICATION

The present application claims the benefit of priority to the Chinese patent application No. 202110928600.4, filed on Aug. 13, 2021, and entitled "Charging Device," the entire content of which is incorporated herein by reference.

TECHNICAL FIELD

The present disclosure relates to the field of electricity, and in particular to a charging device.

BACKGROUND

With the development of science and technology, the junction field-effect transistor (JFET) has been widely used in the charging chip of the load. Since the output current of the JFET decreases with the increase of the load voltage, the charging speed of the target load gradually decreases during the charging process. Moreover, due to the limitation of the pinch-off voltage of the JFET, when the load voltage reaches the pinch-off voltage, the output current of the JFET will decrease even to zero. This causes the JFET to be unable to continue to charge the target load to a desired voltage level.

Therefore, it is necessary to provide a charging device that can increase the charging speed of the target load and charge the target load to a desired voltage level.

BRIEF SUMMARY

In order to solve the above-mentioned problems, the present disclosure provides a charging device. The charging device includes a chip circuit provided with a junction field-effect transistor (JFET). In the process of charging a target load, the charging device adjusts a control voltage on a gate of the JFET to increase a pinch-off voltage of the JFET, such that a charging current-voltage curve of the JFET shifts to the right. Therefore, during the charging process, when the voltage of the target load gradually increases close to an initial pinch-off voltage, the charging device can still maintain a certain charging current output, and finally successfully complete the charging of the target load.

On the one hand, the present disclosure provides a charging device, where the charging device may be an integrated circuit on a chip. The charging device comprises: an input terminal, configured to receive an input voltage; an output terminal, configured to connect a target load so as to charge the target load; a control terminal, configured to receive a control voltage; a junction field-effect transistor (JFET), comprising at least: a drain, electrically connected to the input terminal so as to receive the input voltage; a source, electrically connected to the output terminal so as to output an output voltage and an output current; and a gate, electrically connected to the control terminal; and a control circuit, electrically connected to the control terminal, and configured to change the control voltage based on a change in a load voltage, so as to change a pinch-off voltage of the JFET by controlling a bias voltage on the gate, thereby controlling the output current.

In some embodiments, when the input voltage is constant, the output current decreases as the load voltage applied to the output terminal increases; and when the load voltage is constant, the output current changes as the control voltage changes.

In some embodiments, the input voltage is a direct current (DC) voltage.

In some embodiments, when the load voltage is constant, the output current increases as the control voltage increases.

In some embodiments, the control circuit is configured to increase the control voltage as the load voltage increases, thereby increasing the output current under the same load voltage.

In some embodiments, the control circuit comprises: a control input terminal, electrically connected to the output terminal to receive the load voltage; a control output terminal, electrically connected to the control terminal to output the control voltage; and a voltage conversion circuit, electrically connected to the control input terminal and the control output terminal, and convert the load voltage into the control voltage, wherein the magnitude of the control voltage is positively correlated with that of the load voltage.

In some embodiments, the voltage conversion circuit comprises a voltage clamp protection circuit.

In some embodiments, the charging device further comprises an output current control circuit, electrically connected to the output terminal and the source, and configured to control the intensity of the output current such that the output current does not exceed a preset current threshold when the load voltage is a low voltage.

In some embodiments, the output current control circuit detects a voltage of the target load, and changes the impedance of the output current control circuit according to the voltage of the target load.

In some embodiments, the output current control circuit comprises: a resistor set; a switch, turned on or off to change an impedance of the resistor set; and a determination circuit, configured to determine the magnitude of the output current, wherein when the output current is greater than the preset current threshold, the determination circuit controls the switch to be turned off; when the output current is less than the preset current threshold, the determination circuit controls the switch to be turned on.

In some embodiments, the charging device further comprises an input voltage lock circuit, configured to control the input voltage in a stable state.

On the other hand, the present disclosure provides a charging device, comprising: an input terminal, configured to receive an input voltage; an output terminal, configured to connect a target load so as to charge the target load; a control terminal, configured to receive a control voltage; a JFET, comprising at least: a drain, electrically connected to the input terminal so as to receive the input voltage; a source, electrically connected to the output terminal so as to output an output voltage and an output current; and a gate, electrically connected to the control terminal, wherein when the input voltage is constant, the output current decreases as a load voltage applied to the output terminal increases; when the load voltage is constant, the output current changes as the control voltage changes; and a control circuit, electrically connected to the control terminal, and configured to change the control voltage based on a change in the load voltage, thereby controlling the output current.

In some embodiments, when the load voltage is constant, the output current increases as the control voltage increases.

In some embodiments, the control circuit is configured to increase the control voltage as the load voltage increases, thereby increasing the output current under the same load voltage.

In some embodiments, the control circuit comprises: a control input terminal, electrically connected to the output terminal to receive the load voltage; a control output terminal, electrically connected to the control terminal to output the control voltage; and a voltage conversion circuit, electrically connected to the control input terminal and the control output terminal, and convert the load voltage into the control voltage, wherein the magnitude of the control voltage is positively correlated with that of the load voltage.

In some embodiments, the voltage conversion circuit comprises a voltage clamp protection circuit.

In some embodiments, the charging device further comprises an output current control circuit, electrically connected to the output terminal and the source, and configured to control the intensity of the output current such that the output current does not exceed a preset current threshold when the load voltage is a low voltage.

In some embodiments, the output current control circuit detects a voltage of the target load, and changes the impedance of the output current control circuit according to the voltage of the target load.

In some embodiments, the output current control circuit comprises: a resistor set; a switch, turned on or off to change an impedance of the resistor set; and a determination circuit, configured to determine the magnitude of the output current, wherein when the output current is greater than the preset current threshold, the determination circuit controls the switch to be turned off; when the output current is less than the preset current threshold, the determination circuit controls the switch to be turned on.

In some embodiments, the charging device further comprises an input voltage lock circuit, configured to control the input voltage in a stable state.

In summary, the present disclosure can increase the output current of the charging device by adding the control voltage to the gate of the JFET of the charging device. In particular, the charging device increases the output current when the target load is about to be charged to the initial pinch-off voltage of the JFET, thereby increasing the charging speed of the target load by the device. In addition, an output current control circuit of the charging device can further limit the intensity of the output current, so as to prevent a charging interface from heating up or even short-circuiting of the target load due to an excessive intensity of the output current. Therefore, the present disclosure can enhance the charging capability of the JFET and protect the target load.

BRIEF DESCRIPTION OF THE DRAWINGS

Some exemplary embodiments of the present disclosure are described below in detail with reference to the drawings. The same reference numerals indicate similar structures in different views of the drawings. A person of ordinary skill in the art will understand that these embodiments are merely exemplary embodiments rather than limiting embodiments. The accompanying drawings are only for the purpose of illustration and description, and are not intended to limit the scope of the present application. Other embodiments may also accomplish the objects of the present disclosure. Moreover, it should be understood that the drawings are not drawn to scale.

DETAILED DESCRIPTION

Figure 1:
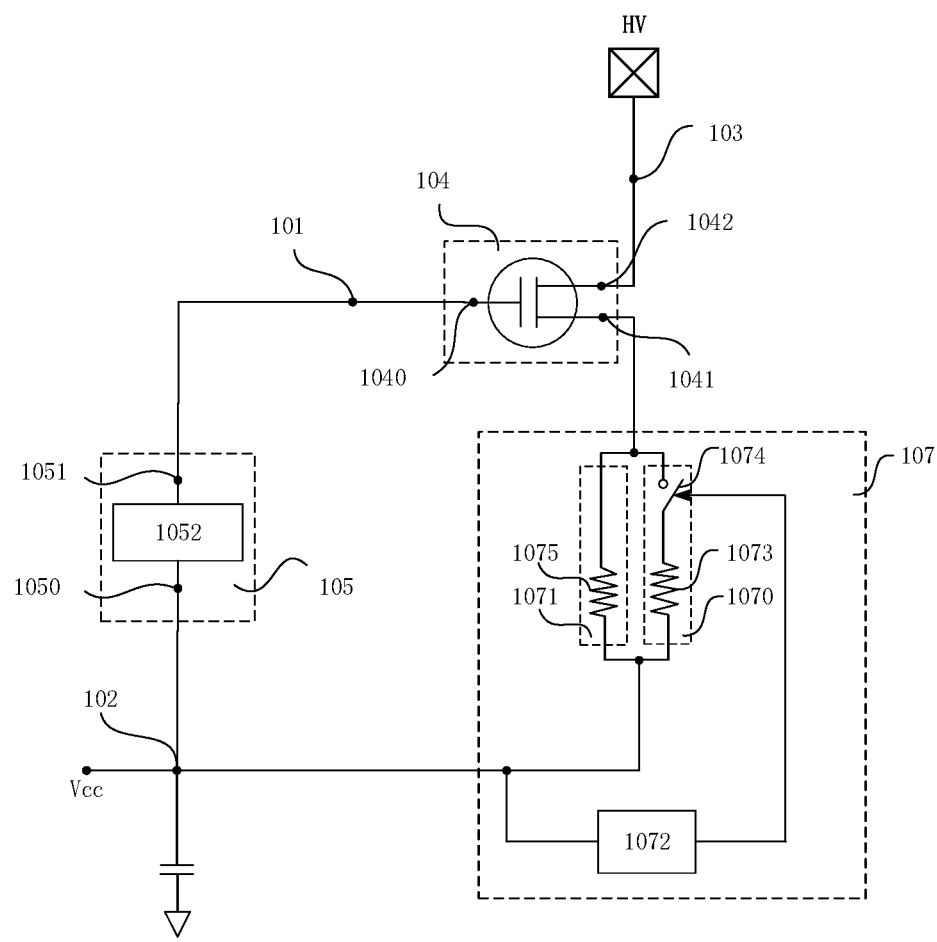
FIG. 1 illustrates a charging device according to some exemplary embodiments of the present disclosure.

The technical solutions of the present disclosure are described in detail below with reference to some exemplary embodiments and accompanying drawings.

In order to clearly explain the technical solutions of certain exemplary embodiments of this disclosure, the following will briefly introduce the drawings used in the description of the embodiment. Obviously, the drawings in the following description are only some examples or embodiments of this disclosure. For those skilled in the art, this disclosure can be applied to other situations according to these drawings without paying creative labor. Unless obvious from the context or otherwise stated, the same reference numerals in the drawings represent the same structure or operation.

It should be understood that "system", "device", "unit" and/or "module" as used herein is a method for distinguishing different components, elements, parts or assemblies at different levels. However, if other words can achieve the same purpose, they can be replaced by other expressions.

As shown in the present disclosure and claims, unless the context clearly suggests exceptional circumstances, the terms "a", "an", and/or "the" do not mean the singular, but may also include the plural. Generally speaking, the terms "including" and "comprising" only imply the inclusion of clearly identified steps and elements, but these steps and elements do not constitute an exclusive list, and methods or devices may also contain other steps or elements.

The terms used in the present disclosure is for the purpose of describing the exemplary embodiments, but not a limitation to the disclosure. For example, unless the context clearly dictates otherwise, a singular description of an element (such as "a", "an" and/or the like) may also include a plurality of the elements. When used in this disclosure, the terms "including" and/or "comprising" mean the presence of associated integers, steps, operations, elements, and/or components, but do not preclude the presence of one or more other features, integers, steps, operations, elements, components, and/or groups or the addition of other features, integers, steps, operations, elements, components, and/or groups to the system/method. When different components described in this disclosure are associated, it may be a direct relationship or an indirect relationship. For example, the term "A is on B" means that A is directly adjacent to B (above or below), and also means that A and B are indirectly adjacent (i.e., there are some substances between A and B); the term "A in B" means that A is all in B or part A is all in B.

Considering the following description, the operation and function of these and other features of the present disclosure, as well as related elements of the structure, as well as the combination and manufacturing economy of components may be significantly improved. Referring to the drawings, all of this form a part of this disclosure. However, it should be clearly understood that the drawings are for illustration and description purposes only and are not intended to limit the scope of the present disclosure. A flowchart is used in this disclosure to illustrate the operations performed by the system according to the embodiment of this disclosure. It should be understood that the preceding or following operations are not necessarily performed accurately in sequence. On the contrary, each step may be processed in reverse order or simultaneously. At the same time, other operations may be added to these procedures, or one or several operations may be removed from these procedures.

The following description provides the specific disclosure scenarios and requirements of this disclosure in order to enable those skilled in the art to make or use the contents of this disclosure. Various modifications to the disclosed embodiments will be apparent to those skilled in the art, and the general principles defined herein may be applied to other embodiments and disclosures without departing from the scope of this disclosure. Therefore, this disclosure is not limited to the illustrated embodiments, but is to be accorded the widest scope consistent with the claims.

The following description can significantly improve these and other features of the present disclosure, as well as the operation and function of related elements of the structure, and the economic efficiency of assembly and manufacture. Referring to the drawings, all of this form a part of this disclosure. However, it should be clearly understood that the drawings are for illustration and description purposes only and are not intended to limit the scope of the disclosure. Moreover, it should be understood that the drawings are not drawn to scale.

FIG. 1 illustrates a charging device 100 (hereinafter referred to as a device 100) according to some exemplary embodiments of the present disclosure. The device 100 may include a control terminal 101, an output terminal 102, an input terminal 103, and an integrated circuit (IC) on a chip. The IC may include a junction field-effect transistor (JFET) 104, a control circuit 105 and an output current control circuit 107. The JFET may further include a gate 1040, a source 1041 and a drain 1042.

The input terminal 103 of the device 100 may receive an input voltage, such as a high voltage (HV). The input voltage may be a direct current (DC) voltage. The input terminal is electrically connected to the drain 1042 of the JFET. The input voltage may be input to the JFET 104 to generate an output voltage and output the output voltage from the output terminal 102 through the JFET 104 and other circuits or ports of the device 100.

It should be understood that the electrical connection of two ports mentioned in the present disclosure may refer to the direct connection of the two ports, or may refer to the indirect connection of the two ports, for example, the two ports may be connected through an intermediate element.

The drain 1042 of the JFET 104 is electrically connected to the input terminal 103 to receive the input voltage. After the input voltage is input to the drain 1042, the JFET 104 and other circuit or port of the device 100 may generate an output voltage and output the output voltage from the output terminal 102. The device 100 may charge the target load (not shown) through the output terminal 102. For example, a voltage common collector (Vcc) pin of the target load may be electrically connected to the output terminal 102, and the device 100 may charge the target load through the Vcc pin. The voltage of the target load may be referred to as a load voltage.

Figure 2A:
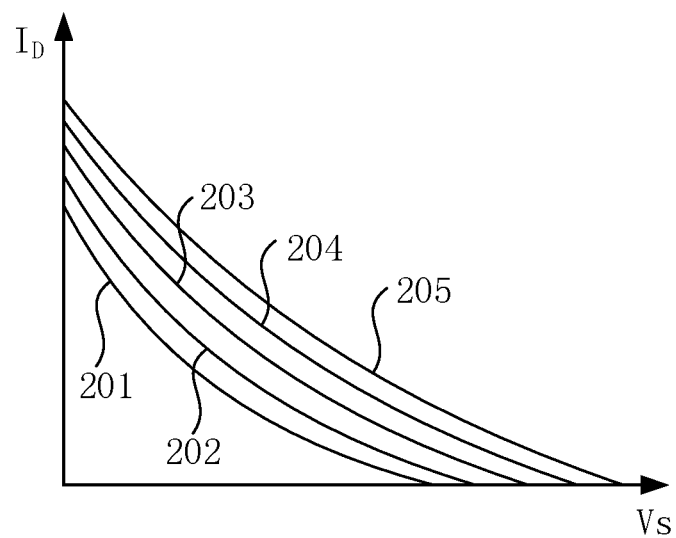
FIG. 2A illustrates a relationship between a source voltage and an output current of a junction field-effect transistor (JFET) at different gate voltages according to some exemplary embodiments of the present disclosure.
Figure 2B:
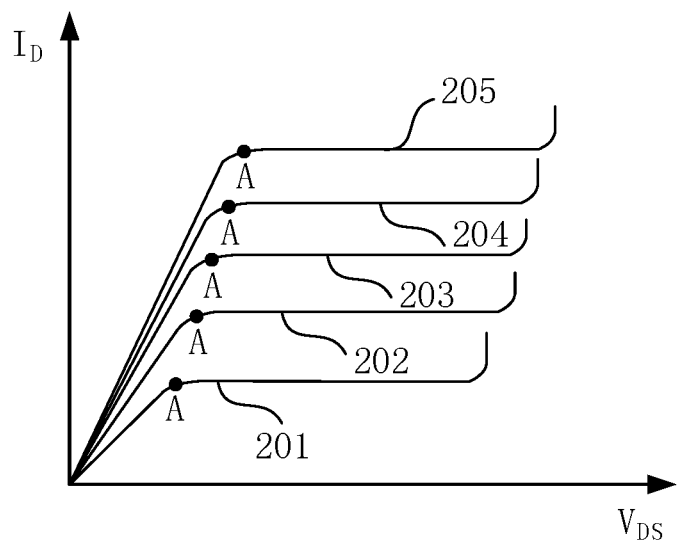
FIG. 2B illustrates a change of a pinch-off voltage of the JFET at different gate voltages according to some exemplary embodiments of the present disclosure.

The control circuit 105 may output a control voltage to the gate 1040. The control voltage may control the output current. FIG. 2A illustrates source voltage-output current curves of the JFET 104 under different gate voltages; FIG. 2B illustrates changes of a pinch-off voltage of the JFET under different gate voltages. In FIG. 2A, the abscissa represents the source voltage VS, and the ordinate represents the output current ID. In FIG. 2B, the abscissa represents a source/drain voltage difference VDS, and the ordinate represents the output current. In FIG. 2A and FIG. 2B, curves 201, 202, 203, 204 and 205 respectively correspond to different control voltages (i.e. gate voltages). For example, in FIG. 2A, the curves 201, 202, 203, 204 and 205 respectively correspond to source voltage-output current relationships under different control voltages. In FIG. 2B, curves 201, 202, 203, 204 and 205 respectively correspond to drain/source voltage difference-output current relationships under different control voltages. The control voltages gradually increase from the curve 201 to the curve 205, that is, the control voltage in the curve 201 is the lowest, and the control voltage in the curve 205 is the highest. It can be seen from FIGS. 2A and 2B that when the control voltages gradually increase, the source voltage-output current curves shift to the right, and the pinch-off voltages rise accordingly. When the control voltage is kept constant, the source voltage also gradually increases during the gradual increase of the load voltage, and accordingly the output current gradually decreases. When the source voltage reaches the drain voltage, the charging current decreases to zero. When the output current is zero, the corresponding source voltage is the pinch-off voltage VDS. This means that as the device 100 continuously charges the target load through the output terminal 102, the load voltage of the target load itself continues to increase. When the load voltage increases, the output current continuously decreases. When the load voltage makes the source voltage reach the pinch-off voltage, there is no output current, that is, the output current is zero. Therefore, when the source voltage is about to reach the pinch-off voltage, the charging speed of the device 100 to the target load gradually decreases. This will greatly prolong the charging time of the device 100 to the target load in actual practice. After the load voltage reaches the pinch-off voltage, the device 100 will no longer charge the target load.

It can also be seen from FIG. 2B that when the output current and the source voltage (or the load voltage) are the same, a higher control voltage will lead to a higher pinch-off voltage A of the JFET. Therefore, the device 100 can increase the pinch-off voltage by increasing the control voltage. In this way, when the voltage of the target load causes the source voltage to reach the original pinch-off voltage, the output current does not decrease to zero, that is, the device 100 can continue to charge the target load. By increasing the control voltage, the target load can be charged to a desired voltage level.

It can be seen from the change from the curve 201 to the curves 202, 203, 204 and 205 in FIG. 2A that when the load voltage is constant (that is, the source voltage is constant) and the control voltage (or the gate voltage) increases, the output current increases. When the output current increases, the charging speed of the target load may also be increased, so the rapid charging of the target load can be realized by increasing the control voltage. That is, when the load voltage is constant, the output current changes as the control voltage changes. Specifically, the output current decreases as the control voltage decreases, and the output current also increases as the control voltage increases. Therefore, the charging speed of the target load can be increased by increasing the control voltage, so as to realize the rapid charging of the target load.

In summary, the control circuit 105 may be configured to change the control voltage based on the change in the load voltage. Thus, by controlling a bias voltage on the gate 1040, the pinch-off voltage of the JFET is changed, thereby controlling the output current. Specifically, the control circuit 105 may be configured to increase the control voltage as the load voltage increases, thereby increasing the output current under the same load voltage. For example, the control circuit 105 may be configured to adjust the control voltage according to the change of the load voltage at any time. For example, when the load voltage increases, it increases the control voltage accordingly. When the load voltage remains unchanged, that is, for a constant load voltage, the control circuit 105 may be configured to change the output current as the control voltage changes. Specifically, the output current may increase as the control voltage increases.

Specifically, the control circuit 105 may include a control input terminal 1050, a control output terminal 1051 and a voltage conversion circuit 1052. For example, the voltage conversion circuit 1052 may include a voltage clamp protection circuit. The voltage clamp protection circuit may be a Zener diode composed of multiple diodes connected in series. The control input terminal 1050 may be electrically connected to the output terminal 102 to receive the load voltage. The control output terminal 1051 may be electrically connected to the control terminal 101 to output the control voltage. The voltage conversion circuit 1052 may be electrically connected to the control input terminal 1050 and the control output terminal 1051 to convert the load voltage into the control voltage. The magnitude of the control voltage is positively correlated with that of the load voltage. For example, when the device 100 charges the target load through the output terminal 102, the load voltage continuously increases with time. The control input terminal 1050 instantly receives the load voltage of the output terminal 102. The voltage conversion circuit 1052 converts the load voltage received immediately into the control voltage, and outputs the control voltage to the control terminal 101 through the control output terminal 1051. When the load voltage value is high, the control voltage converted by the voltage conversion circuit 1052 is also high. When the load voltage is low, the control voltage converted by the voltage conversion circuit 1052 is also low. The gate 1040 is electrically connected to the control terminal 101. Therefore, when the bias voltage on the gate 1040 increases, the pinch-off voltage of the JFET increases, the output current also increases, and finally the charging speed of the device 100 to the target load increases.

The source 1041 of the JFET may be electrically connected to the output terminal 102, and the output terminal 102 may output the output voltage and the output current. Meanwhile, the output terminal 102 may be used as a charging interface for connecting and charging the target load. For example, the output terminal 102 may be connected to the Vcc pin of the target load, so as to charge the target load through the Vcc pin.

In some exemplary embodiments of the present disclosure, an output current control circuit 107 may be further provided between the source 1041 and the output terminal 102. The output current control circuit may control the magnitude of the output current such that in the early stage of charging, when the voltage of the target load is low, the charging current is not too large. In some embodiments, the charging current control circuit is configured to sense the voltage of the target load, and change the impedance of the output current control circuit according to the voltage of the target load. For example, the output current control circuit 107 may be provided with a switch, a resistor set and a determination circuit. The switch is turned on or off to adjust an impedance of the resistor set. The determination circuit is configured to determine the magnitude of the output current, and control the on or off of the switch based on a determination result. When the switch is turned on, the impedance of the output current control circuit 107 is impedance 1. When the switch is turned off, the impedance of the output current control circuit 107 is impedance 2. The impedance 1 is different from the impedance 2. When the impedance is different, the output current is also different. Therefore, the output current control circuit 107 may adjust the impedance by controlling the on or off of the switch, thereby adjusting the intensity of the output current.

For example, the output current control circuit 107 may include a first line 1070, a second line 1071 and a determination circuit 1072. The first line 1070 may include a first resistor 1073 and a switch 1074, and the first resistor 1073 and the switch 1074 are connected in series. The second line 1071 may include a second resistor 1075, and the second line 1071 is connected in parallel with the first line 1070. The determination circuit 1072 may be configured to determine the magnitude of the output current, and control the on or off of the switch based on a determination result. The output current control circuit 107 may be electrically connected to the output terminal 102 and the source 1041, and is configured to control the intensity of the output current such that the output current does not exceed a preset current threshold when the load voltage is a low voltage.

Specifically, the output current control circuit 107 may first obtain the intensity of the output current output by the source 1041, and then control the switch 1074 to be turned on or off according to the intensity of the output current. When the switch 1074 is turned on, the impedance is the total impedance of the first resistor 1073 and the second resistor 1075 in parallel. When the switch 1074 is turned off, the impedance is the impedance of the second resistor 1075. Since the first resistor 1073 and the second resistor 1075 are connected in parallel, the switch 1074 corresponds to two different impedances when it is turned on and when it is turned off. The impedance when the switch 1074 is turned on is less than that when the switch 1074 is turned off.

Therefore, in order to make the intensity of the output current below the preset current threshold, when the output current is greater than the preset current threshold, the determination circuit 1072 may be configured to control the switch 1074 to be turned off, that is, a greater impedance may be set to reduce the intensity of the output current. When the output current is less than the preset current threshold, the determination circuit 1072 controls the switch 1074 to be turned on, that is, a smaller impedance may be set to ensure the intensity of the output current. That is, the output current control circuit 107 may adjust the intensity of the output current through two different impedances, such that the current intensity of the output current at the output terminal 102 does not exceed the preset current threshold.

It should be understood that according to FIG. 2A and the analysis thereof, when the voltage of the load voltage is low, the output current is large, which may cause the circuit and/or the chip to overheat during an experiment of short-circuit to ground or a similar disclosure condition. Therefore, in some exemplary embodiments of the present disclosure, the output current control circuit 107 may be configured to mainly focus on a low-voltage stage of the load voltage, that is, to limit the output current of the load voltage in the low-voltage stage, for example, to make the output current less than 1 mA (the preset current threshold). It should be understood that the value of 1 mA is not fixed, and those skilled in the art may set the preset current threshold according to actual conditions. That is, when the load voltage is in the low-voltage stage, the switch 1074 may be controlled to be turned off such that the output current does not exceed the preset current threshold. When the load voltage is not in the low-voltage stage, the switch 1074 may be controlled to be turned on.

It should also be understood that the function of the output current control circuit 107 is to limit the intensity of the output current, that is, to limit the current intensity at the output terminal 102. This is because when the intensity of the output current exceeds the preset current threshold, the target load may heat up or even short-circuit, which may damage the target load. Therefore, the output current control circuit 107 limits the intensity of the output current so as to protect the target load and the charging circuit on the chip.

In summary, the present disclosure may increase the output current of the device 100 through the control circuit 105, especially the output current when the target load is about to be charged to the pinch-off voltage of the JFET, thereby improving the charging speed of the device 100 to the target load. In addition, the control circuit 105 can raise the pinch-off voltage of the JFET, such that the output current is not zero before the target load is fully charged. In this way, the device 100 may charge the target load to a desired voltage level. Finally, the output current control circuit 107 may further limit the intensity of the output current, so as to avoid the target load from heating up or even short-circuiting when the intensity of the output current is too large. Therefore, the present disclosure can enhance the charging capability of the JFET and protect the target load.

In summary, after reading this detailed disclosure, those skilled in the art may understand that the foregoing detailed disclosure may be presented by way of example only and may not be restrictive. Although not explicitly stated here, those skilled in the art will understand that this disclosure is intended to cover various reasonable changes, improvements and modifications to the embodiments. These changes, improvements and modifications are intended to be proposed by this disclosure and are within the spirit and scope of the exemplary embodiments of this disclosure.

It should be understood that the term "and/or" used in this embodiment includes any or all combinations of one or more of the associated listed items. It should be understood that when an element is referred to as "connected" or "coupled" to another element, it may be directly connected or coupled to the other element, or an intermediate element may be present.

Similarly, it should be understood that when an element such as a layer, a region or a substrate is referred to as being "on" another element, it may be directly on the other element or the intermediate element may be present. In contrast, the term "directly" means that there are no intermediate elements. It should also be understood that, when used in this disclosure, the terms "including" and/or "comprising" mean the presence of associated features, integers, steps, operations, elements, and/or components, but do not preclude the presence of one or more other features, integers, steps, operations, elements, components, and/or groups or the addition of other features, integers, steps, operations, elements, components, and/or groups to the system/method. It should also be understood that although the terms first, second, third, etc. may be used herein to describe various elements, these elements should not be limited by these terms. These terms are only used to distinguish one element from another. Thus, a first element in some embodiments could be termed a second element in other embodiments without departing from the teachings of the disclosure. The same reference numbers or the same reference numerals will be used throughout the disclosure.

The embodiments of the present disclosure should not be construed as limited to the shapes of the regions illustrated herein, but should include variations resulting from, for example, manufacturing. For example, an etched region illustrated as a rectangle will typically have rounded or curved features. The regions illustrated in the figures are, therefore, not intended to illustrate the actual shape of the regions of the device or the scope of the exemplary embodiments.

What is claimed is:

1. A charging device, comprising:
    an input terminal, configured to receive an input voltage;
    an output terminal, configured to connect to a target load so as to charge the target load;
    a control terminal, configured to receive a control voltage;
    a junction field-effect transistor (JFET), including at least one of:
        a drain, electrically connected to the input terminal so as to receive the input voltage,
        a source, electrically connected to the output terminal so as to output an output voltage and an output current, or
        a gate, electrically connected to the control terminal; and
    a control circuit, electrically connected to the control terminal, and configured to change the control voltage based on a change in a load voltage, so as to change a pinch-off voltage of the JFET by controlling a bias voltage on the gate, thereby controlling the output current; and
    an input voltage lock circuit, configured to maintain the input voltage in a stable state.

2. The charging device according to claim 1, wherein
    when the input voltage is constant, the output current decreases as the load voltage applied to the output terminal increases; and
    when the load voltage is constant, the output current changes as the control voltage changes.

3. The charging device according to claim 1, wherein the input voltage is a direct current (DC) voltage.

4. The charging device according to claim 2, wherein
    when the load voltage is constant, the output current increases as the control voltage increases.

5. The charging device according to claim 4, wherein
    the control circuit is configured to increase the control voltage as the load voltage increases, thereby increasing the output current under the same load voltage.

6. The charging device according to claim 5, wherein the control circuit includes:
    a control input terminal, electrically connected to the output terminal to receive the load voltage;
    a control output terminal, electrically connected to the control terminal to output the control voltage; and
    a voltage conversion circuit, electrically connected to the control input terminal and the control output terminal to convert the load voltage into the control voltage, wherein
    a value of the control voltage is positively correlated with a value of the load voltage.

7. The charging device according to claim 6, wherein the voltage conversion circuit includes a voltage clamp protection circuit.

8. The charging device according to claim 1, further comprising:
    an output current control circuit, electrically connected to the output terminal and the source, and configured to control an intensity of the output current such that the output current does not exceed a preset current threshold when the load voltage is a low voltage.

9. The charging device according to claim 8, wherein the output current control circuit detects a voltage of the target load, and changes an impedance of the output current control circuit based on a voltage of the target load.

10. The charging device according to claim 9, wherein the output current control circuit includes:
a resistor set;
a switch, turned on or off to change an impedance of the resistor set; and
a determination circuit, configured to determine a value of the output current, wherein
when the output current is greater than the preset current threshold, the determination circuit controls the switch to be turned off, and
when the output current is less than the preset current threshold, the determination circuit controls the switch to be turned on.

11. A charging device, comprising:
an input terminal, configured to receive an input voltage;
an output terminal, configured to connect to a target load so as to charge the target load;
a control terminal, configured to receive a control voltage;
a JFET, including at least one of:
a drain, electrically connected to the input terminal so as to receive the input voltage,
a source, electrically connected to the output terminal so as to output an output voltage and an output current, or
a gate, electrically connected to the control terminal, wherein when the input voltage is constant,
the output current decreases as a load voltage applied to the output terminal increases, and
when the load voltage is constant, the output current changes as the control voltage changes;
a control circuit, electrically connected to the control terminal, and configured to change the control voltage based on a change in the load voltage, thereby controlling the output current; and
an input voltage lock circuit, configured to maintain the input voltage in a stable state.

12. The charging device according to claim 11, wherein when the load voltage is constant, the output current increases as the control voltage increases.

13. The charging device according to claim 12, wherein the control circuit is configured to increase the control voltage as the load voltage increases, thereby increasing the output current under the same load voltage.

14. The charging device according to claim 13, wherein the control circuit includes:
a control input terminal, electrically connected to the output terminal to receive the load voltage;
a control output terminal, electrically connected to the control terminal to output the control voltage; and
a voltage conversion circuit, electrically connected to the control input terminal and the control output terminal to convert the load voltage into the control voltage, wherein
a value of the control voltage is positively correlated with a value of the load voltage.

15. The charging device according to claim 14, wherein the voltage conversion circuit includes a voltage clamp protection circuit.

16. The charging device according to claim 11, further comprising:
an output current control circuit, electrically connected to the output terminal and the source, and configured to control an intensity of the output current such that the output current does not exceed a preset current threshold when the load voltage is a low voltage.

17. The charging device according to claim 16, wherein the output current control circuit detects a voltage of the target load, and changes an impedance of the output current control circuit based on a voltage of the target load.

18. The charging device according to claim 17, wherein the output current control circuit includes:
a resistor set;
a switch, turned on or off to change an impedance of the resistor set; and
a determination circuit, configured to determine magnitude value of the output current, wherein
when the output current is greater than the preset current threshold, the determination circuit controls the switch to be turned off; and
when the output current is less than the preset current threshold, the determination circuit controls the switch to be turned on.

* * * * *